United States Patent
Calrson

(10) Patent No.: US 7,142,004 B2
(45) Date of Patent: Nov. 28, 2006

(54) RADIATION HARDENING OF LOGIC CIRCUITRY USING A CROSS ENABLED, INTERLOCKED LOGIC SYSTEM AND METHOD

(75) Inventor: Roy M Calrson, Plymouth, MN (US)

(73) Assignee: Honeywell International Inc., Morristown, NJ (US)

( * ) Notice: Subject to any disclaimer, the term of this patent is extended or adjusted under 35 U.S.C. 154(b) by 106 days.

(21) Appl. No.: 10/759,913

(22) Filed: Jan. 15, 2004

(65) Prior Publication Data

US 2005/0156620 A1    Jul. 21, 2005

(51) Int. Cl.
*H03K 19/007* (2006.01)

(52) U.S. Cl. .......................... 326/14; 326/10

(58) Field of Classification Search ............. 326/9–10, 326/13–14, 56–58, 112, 119, 121
See application file for complete search history.

(56) References Cited

U.S. PATENT DOCUMENTS

| | | | |
|---|---|---|---|
| 5,870,332 A | 2/1999 | Lahey et al. | |
| 6,278,287 B1 * | 8/2001 | Baze | ............................. 326/9 |
| 6,327,176 B1 * | 12/2001 | Li et al. | ..................... 365/156 |
| 6,504,411 B1 * | 1/2003 | Cartagena | .................. 327/199 |
| 6,614,257 B1 * | 9/2003 | Knowles | ......................... 326/9 |
| 2002/0175713 A1 * | 11/2002 | Knowles | ...................... 326/119 |

OTHER PUBLICATIONS

"Overview: Single Event Upset Design Techniques for UTMC's RadHard MSI Logic Family", http://ams.aeroflex.com/ProductFiles/AppNotes/MSI/seu1.pdf, printed Feb. 1, 2005, pp. 1-6.
International Search Report dated Jun. 28, 2005.

* cited by examiner

*Primary Examiner*—James H. Cho
(74) *Attorney, Agent, or Firm*—McDonnell Boehnen Hulbert & Berghoff LLP

(57) ABSTRACT

A system and method for hardening a logic circuit against radiation-event effects is provided. The system may include a logic circuit, first and second feed-forward devices, and first and second feedback devices. The logic circuit may be operable to output independently-obtained first and second redundant signals responsive to a desired input signal. Each of the first and second feed-forward devices may receive both of the first and second redundant signals. When the first and second redundant signals are in expected states, then the first and second feed-forward devices may responsively provide respective first and second feed-forward signals. Each of the first and second feedback devices may receive both of the first and second feed-forward signals. When the first and second feed-forward signals are in expected states, then the first and second feedback devices responsively feed respective first and second feedback signals back to the respective first and second redundant signals.

54 Claims, 9 Drawing Sheets

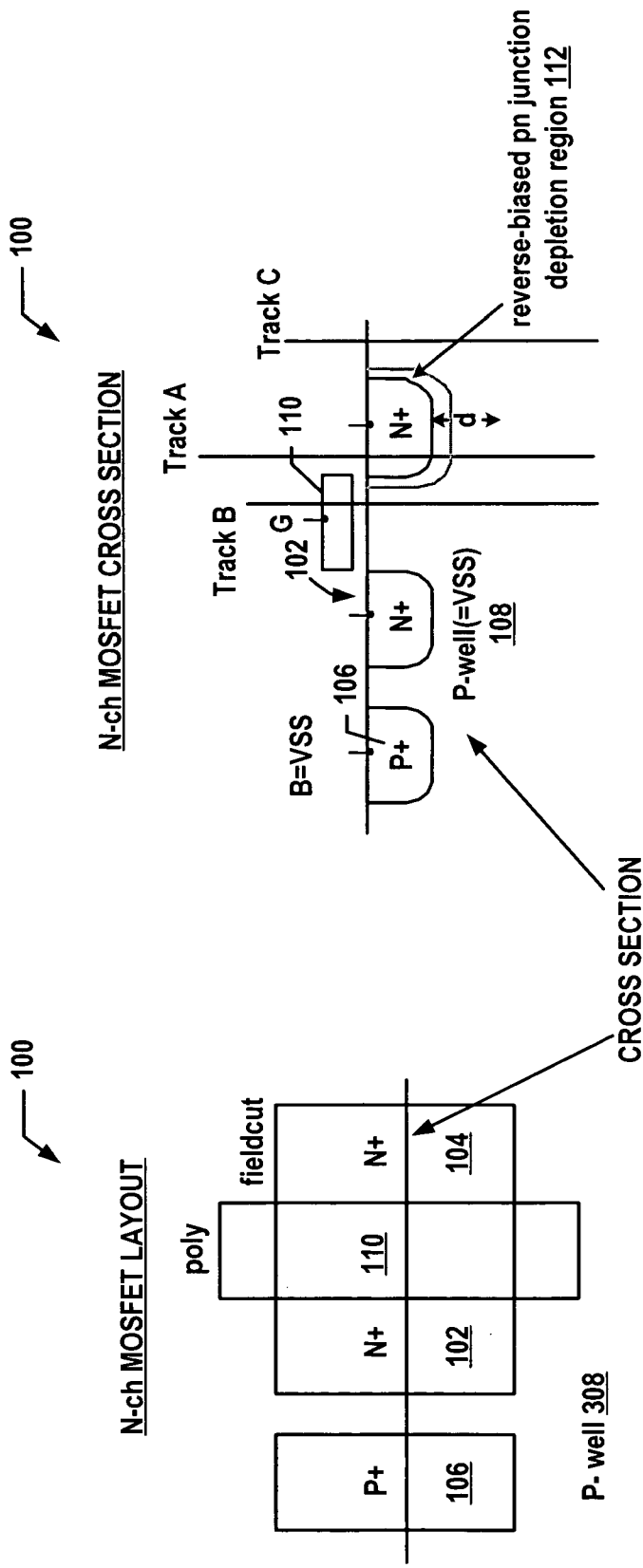

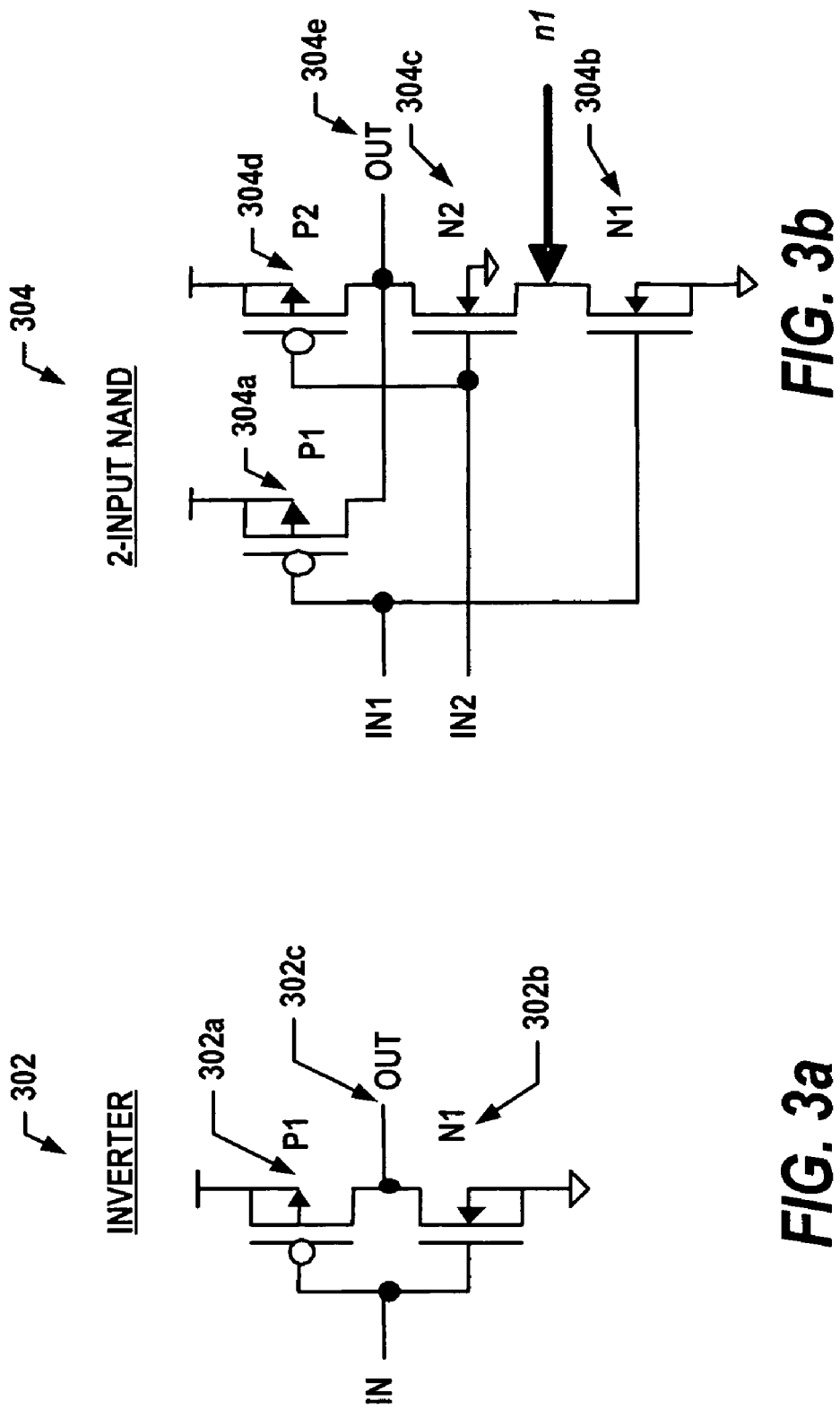

RADIATION HARDENING OF LOGIC CIRCUITRY USING A CROSS ENABLED, INTERLOCKED LOGIC SYSTEM AND METHOD

BACKGROUND

1. Field

The following relates to microelectronic circuits, and more particularly, to single-event effect ("SEE") resistant or hardened circuits.

2. Related Art

Integrated circuits used in devices that operate in intergalactic space, earth orbital space, and high atmospheric altitudes (e.g., commercial flight altitudes) generally have to be highly reliable and operate using very low levels of power. Along with these necessities, space, weight and cost limitations generally cause these integrated circuits be very densely populated and highly complex.

As a consequence of operating in intergalactic space, earth orbital space, and high atmospheric altitudes, however, the integrated circuits are exposed to a large amount of radiation, which can effect their operation and, in turn, their reliability. Because the Earth's magnetic field deflects most outer space radiation, terrestrial-based integrated circuits are not normally exposed to large amounts of radiation. Recently, however, several radiation-laden atmospheric storms, which emanated from a coronal mass ejection of the sun, expanded into space, penetrated the Earth's magnetic field and disrupted a significant amount of terrestrial-based devices that use integrated circuits.

The disruptions caused by the radiation events are believed to result from Alpha particles (hereinafter "radiation particles") interacting with the semiconductor materials (e.g., silicon) that make up the integrated circuits. These radiation particles are by-products of the natural decay of elements, and/or radiation (having kinetic energy) protons, neutrons, electrons, and all the natural elements. The radiation particles are abundant in a wide range of energies in intergalactic space, earth orbital space, high atmospheric altitudes (e.g., commercial flight altitudes), and, as noted above, terrestrial space.

When a radiation particle interferes with an integrated circuit, it can slow the circuit's performance and even upset circuit operation. For example, a radiation particle can change the conductance of a metal-oxide-semiconductor ("MOS") transistor by changing its threshold voltage ($V_t$). In Very Large Scale Integration (VLSI) circuits, radiation particles can also generate significant transient voltage and current disturbances on internal supply networks (e.g. power and ground nodes).

A radiation particle that passes into and through an integrated-circuit device transfers energy from the particle into the material surrounding the region into which the particle strikes or "hits." This energy transfer creates undesirable hole-electron pairs in the surrounding region. This event is known as Linear Energy Transfer (LET), which may be expressed in the units of MeV-cm2/mg. For given material densities, the LET can be converted into units of Coulombs/cm along a track that a particle travels once the activation energy for a hole-electron pair is determined. As a result, the particle can only create a finite amount of charge per unit distance over the length of its track.

As its energy and mass increase, the LET of the particle also increases. The LET, however, does not increase unbounded, but rather reaches a maximum value regardless of how much energy the particle possesses. Once the particle achieves the maximum LET, the addition of more energy counter intuitively results in a reduction in the LET.

The charge that a particle creates may be collected in the structure of the semiconductor device. The amount of collected charge can be calculated by multiplying the LET (C/cm) by the distance that the particle travels along the particle track. For example, the amount of charge collected in a continuous lightly-doped-drain (LDD) region of a MOSFET transistor caused by a particle traveling along the LDD region may be calculated by multiplying the LET (C/cm) by the length of such LDD region.

The charge collection along this particle track, however, may be truncated by oxide regions, degenerately doped P+ and N+ source-drain regions, and/or degenerately doped P+ and N+ well connection regions. While a particle can travel significant distances through the silicon material, the charge collected from the particle traveling along a particle track subsides at a given distance of the particle track. This distance limit may be in the range of a few microns.

The number of hole-electron pairs separated along the track length of the radiation particle, however, is finite, so the nodal voltage disturbances may be temporary or have only a transient effect. In addition, the density of the radiation particles striking the integrated circuit is generally small enough that the disturbances caused by the radiation particles are treated as single events in time. Such transient disturbances are known as single-event transient (SET) conditions.

After experiencing a SET condition, transistor nodes typically return to their desired voltage states. Consequently, the SET condition might not be a problem in and of itself. The consequence of having a temporary voltage disturbance on the transistor node, however, may be problematic because the SET condition may be propagated through the larger system. When the SET condition causes an undesirable change in the state of the larger system, it may be referred to as a single-event upset (SEU) condition.

However, for each particle strike, a finite volume exists around a critical node through which a particle must pass to create a SET and/or SEU condition (collectively referred to as Single Event Effect (SEE) conditions). This finite volume may be referred to as the sensitive volume. If the particle strike is outside the sensitive volume, the created charge may not be able to get to the critical node to cause a SEE condition.

The more charge a circuit can accumulate before a SEE condition results, the greater the LET the circuit can tolerate. Increasing this tolerance is known as SET, SEU, and/or SEE condition hardening. The energized particle environment contains a variety of particle types and energies that result in a wide range of LETs. The density of particles versus LET decreases as the LET increases.

Particles that strike transistors do not have a directional dependence; i.e., they can strike from any direction. If the LET that can cause a SEE condition and size of the sensitive volume is known, the probability of a SEE condition can be determined. These probabilities may be referred to as Soft Error Rates (SER) because they are not due to design or manufacturer defects, and because they can be corrected.

FIGS. 1a and 1b are block diagrams illustrating a simplified layout and cross-section of an N-Channel MOSFET 100 experiencing a particle strike. The N-Channel MOSFET 100 may be fabricated using a bulk material technology, such as bulk CMOS. The N-Channel MOSFET includes an N+ source 102, N+ drain 104, and a P+ body tie 106 all of which may be fabricated in a P-well 108; on top of which a polysilicon and oxide gate 110 may formed.

When a particle strikes the N+ drain 104 and travels along one of finite number of perpendicular particle tracks, such as track A, the charge of the particle may be collected over a certain distance of the P-type well 108, such as the distance 'd'. The amount of charge collected along distance 'd' may be greater than the charge that is created by the initial particle strike.

Consider, for example, the N-channel MOSFET 100 in an "OFF" state in which its source 102 and body tie 106 are connected to $V_{SS}$, and its drain 104 is held at a high state. The high state may be a state sufficient to reverse bias the PN junction between the N+ drain 104 and the P-Well 108. The N+ drain 104 may be held in the high state, for example, by a P-channel MOSFET (not shown) in an "ON" state. In this reversed-biased state, a depletion region 112 is created in the P-well 108 at interface of the PN junction.

When a particle passes through the PN junction along, for example, the particle track A, then the hole-electron pairs along the particle track A may be separated by the voltage difference between the N+ drain 104 and a P-well 108. The resultant electron charge from the separation of the hole-electron pairs may collect along the particle track 'A' in the P-well 108 from about the interface of the N+ drain 104 to the maximum collection distance limit. Consequently, a drain-discharge current along the distance 'd' of the particle track 'A' may be created from the resultant collection of electrons.

The holes generated along distance 'd' are repelled back to the P+ body tie 106, and then travel through the P+ body tie 106 connection to $V_{SS}$. These traveling holes may also produce a current. Since the P+ body tie 106 may be ohmic or resistive, the current created by the holes traveling through the P+ body tie 106 may create a voltage rise from between the P+ body tie 106 to the $V_{SS}$ connection.

If this voltage rise is large enough to forward bias the P-well 108 to N+ source 102 junction under the gate oxide, a parasitic NPN-bipolar-junction transistor (not shown) coupling the N+ drain 104 to the N+ source 102 may switch to an ON state. The current resulting from the traveling holes is then multiplied by the gain of the parasitic NPN-bipolar-junction transistor (BJT), and appears as a discharge current on the N+ drain 104. This discharge current only flows if the parasitic BJT is turned on. Thus, the discharge current may be approximately equal to the charge created by the particle intrusion multiplied by the gain of the parasitic BJT.

As illustrated, a particle traveling along particle tracks 'B' and 'C' does not traverse the drain depletion region 110. However, the charges created by particles traveling along the B and C particle tracks diffuse to the nearest depletion region, which in this case is the drain-depletion region 110. As the diffusing holes and electrons reach the drain-depletion region 110, the electrons will be collected by the N+ drain 104 and the holes will be repelled back into the P-well 108, again creating the possibility of turning on the parasitic BJT.

FIGS. 2a and 2b are block diagrams illustrating a simplified layout and cross-section of an N-Channel MOSFET 200 experiencing a particle strike. The N-Channel MOSFET 200 may be fabricated using a bulk material technology, such as bulk CMOS. The N-Channel MOSFET 200 shown in FIGS. 2a and 2b is similar to the N-Channel MOSFET 100 shown in FIGS. 1a and 1b except that the N-Channel MOSFET 200 further includes an N-well 208 into which the P-well 108 is formed.

When a particle travels along the particle track A, the portion of the track from which charge is collected is longer than in the N-Channel MOSFET 100 since the particle also crosses the P-well-to-N-well reversed-biased junction 208 under the N-channel MOSFET 200. Because the particle crosses the P-well-to-N-well reverse-biased junction 208, more electrons may be collected by the N+ drain 104, and more holes may be collected by the P-well 108, which increases the current in the P-well 108.

This may increase the voltage at the junction of the P-well 108 and N+ source 102 under the gate oxide. The net result is that the charge that appears at the N+ drain 104 is the combination of the created charge that flows between the N+ drain 104 and P+ body tie 106 plus the created charge times the gain of the parasitic BJT (if turned on) that flows between N+ drain 104 and N+ source 102. Both of these currents increase the probability of a SET, SEU, and/or SEE conditions.

FIGS. 3a and 3b are schematics of a CMOS inverter 302 and a CMOS two-input NAND gate 304, both of which are susceptible to SEE conditions. The inverter 302 may include a P-Channel transistor 302a coupled in series with an N-Channel transistor 302b. An output signal (designated as the "OUT" signal) is provided from an output terminal 302c located at a node at the intersection of the P-Channel transistor 302a and N-Channel transistor 302b. The gates of the P-Channel transistor 302a and the N-Channel transistor 302b are tied to an input signal (designated as "IN signal"). When the IN signal is a low state, then the P-Channel transistor 302a is in an ON state and the N-Channel transistor 302b is in an OFF state, which causes the OUT signal to be in a high state.

If a particle strikes the N-Channel transistor 302b, then the created charge in N-Channel transistor 302b may result in a pull-down current that competes against the pull-up current of P-Channel transistor 302a, which may potentially disturb the high-state OUT signal. For example, when the pull-down current is sufficiently larger than the pull-up current, then the OUT signal may temporarily switch state, i.e., transition a low-state OUT signal. If the inverter 302 is coupled to another logic gate and the OUT signal undesirably switches state, the effect of the errant OUT signal may be further propagated, thereby causing the other logic gate to experience a SET-induced state change. If the pull-down current is large enough to cause the OUT signal to fall to about a $V_{SS}$ level, the OUT signal may remain at about the $V_{SS}$ level until the P-Channel transistor 302a dissipates all of the created charge.

A particle strike on P-Channel transistor 302a, on the other hand, will not disturb the high OUT voltage state because no voltage difference exists within P-Channel transistor 302a to cause charge movement towards the output terminal. Thus, none of the charge created by the particle strike is removed.

If, immediately after the particle strike, the IN signal transitions to a high state, then the P-Channel transistor 302a may transition to an OFF state and the N-Channel transistor 302b may transition to an ON state. The created charge within the P-type transistor 302a may be collected and not dissipated. As such, the collected charge may hinder or slow down the ability of the N-Channel transistor 302b to pull the OUT signal to a low state. The N-Channel transistor 302b may not be able to pull the OUT signal to the low state until it removes the created charge. In this case, the particle strike may not create an immediate state change, but it can delay a desired state change from occurring.

In addition to causing undesirable state changes, the created hole-electron concentrations can be quite high, e.g., much higher than the surrounding structure of the semiconductor device, i.e., higher than the N or P-type impurity concentrations. This may result in a switching lifetime that is temporarily much shorter than normally present in the structure of the semiconductor device. Consequently, one of the SET condition generating mechanisms may result from a particle striking the semiconductor device when a finite voltage is applied across it. As one skilled in the art will recognize, when the IN signal is in a complementary state, then the charge collection mechanism switches from the P-Channel transistor 302a to the N-Channel transistor 302b.

Referring now to FIG. 3b, the NAND gate 304 may include a first P-Channel transistor 304a coupled in series with first and second N-Channel transistors 304b, 304c. The gates of the first P-Channel transistor 304a and the first N-Channel transistor 304b are configured to receive a first of two input signals (designated as an "IN1" signal) for which the NAND gate 304 performs the NAND logical function on. The NAND gate 304 provides an output signal on its output terminal (designated as an "OUT" node) 304e at a node at the intersection of the first P-Channel transistor 304a and second N-Channel transistor 304c. The NAND gate 304 also includes a second P-Channel transistor 304d having its drain coupled to the OUT node 304e. The gates of second N-Channel transistor 304c and the second P-Channel transistor 304d are configured to receive the second of two input signals (designated as an "IN2" signal).

If, for example, the IN1 signal is in a high state and the IN2 signal is in a low state, then (i) the first P-Channel transistor 304a and the second N-Channel transistor 304c are in OFF states, and (ii) the second P-Channel transistor 304d and the first N-Channel transistor 304b are in ON states, thereby causing the OUT signal to be in a high state.

A particle strike on the second N-Channel transistors 304c may create two different pull-down-current paths. The first-pull-down current path may occur from between the drain of and body tie of the second N-Channel transistor 304c. The second-pull-down-current path may occur from between the drain and source of the second N-Channel transistor 304c, if a parasitic BJT (not shown) is turned on. The first N-Channel transistor 304b, however, may present a blocking impedance in series with a pull-down current that can occur between the drain and source of the second N-Channel transistor 304c hindering its ability to pull the OUT signal to a low state.

If, for example, the IN1 and IN2 signals are in low states, then (i) the first and second N-Channel transistors 304b, 304c are in an OFF state, and (ii) the first and second P-Channel transistors 304a, 304d are in and ON state, thereby causing the OUT signal to be in a high state. As above, a particle strike on the second N-Channel transistor 304c creates two pull-down currents; one from between the drain to the body tie of the second N-Channel transistor 304c, and the second from between the drain to the source of the second N-Channel transistor 304c, if a parasitic BJT (not shown) is turned on. However, because the first N-Channel transistor 304b is in an OFF state, then the second pull-down current path may be cut off from $V_{SS}$.

Thus, the only second pull-down current component of the OUT signal is the displacement current that results from charging the capacitance on node n1. This capacitance may be much smaller than the capacitance on the output node 304e, thereby causing little effect on the OUT signal. Accordingly, the majority of the current of the OUT signal results from the first-pull-down current.

The hole travel in the P-well of the second N-Channel transistor 304c, which can turn on its parasitic BJT, may also flow under the first N-Channel transistor 304b, and also turn on the parasitic BJT of the first N-Channel transistor 304b. Consequently, a pull-down current path from the output terminal through both the first and second N-Channel transistors 304c, 304b to $V_{SS}$ is created. Consequently, the state of the OUT signal may not be in the desired state.

As can be readily discerned from above, modern integrated circuits are susceptible to SEE conditions. Some solutions attempting to mitigate this susceptibility require the use of relatively complex combinational logic circuitry to provide logical or temporal isolation of SEE that would otherwise cause errors. These solutions typically are not area efficient. Further, logic and temporal isolation circuit solutions can affect overall circuit speed and may, in some cases, be applicable only to storage circuits. Moreover, the susceptibility of to SEE conditions is heightened by reduced feature sizes and higher clock speeds that are otherwise very desirable. Thus, an area-efficient solution that provides a high degree of SET, SEE and/or SEE hardness and that is also applicable to various circuit types (such as combinational logic circuits as well as memory circuits) is needed.

SUMMARY

A system and method for hardening a logic circuit against at least one of a single-event upset and single-event transient condition is provided. The system may include (and method may be carried out using) a logic circuit, first and second feed-forward devices, and first and second feedback devices.

The logic circuit outputs independently-obtained first and second redundant signals. Each of the first and second feed-forward devices is operable to receive both of the first and second redundant signals. When the first and second redundant signals are in expected states, then (i) the first feed-forward device responsively provides a first feed-forward signal and (ii) the second feed-forward device responsively provides a second feed-forward signal.

Each of the first and second feedback devices is operable to receive both of the first and second feed-forward signals. When the first and second feed-forward signals are in expected states, then (i) the first feedback device responsively feeds a first feedback signal back to the first redundant signal and (ii) the second feedback device responsively feeds a second feedback signal back to the second redundant signal, thereby completing first and second feedback loops.

However, if one or both of the first and second redundant signals are in an unexpected state due to, for example, a radiation-particle intrusion, then one or both of the first and second feed-forward devices do not provide its respective feed-forward signal. Similarly, when one or both of the first and second feed-forward signals are in an unexpected state, then one or both of the first and second feedback devices does not feed back its respective feed-back signal. Consequently, radiation-particle-intrusion effects are not further propagated.

BRIEF DESCRIPTION OF THE DRAWINGS

Preferred embodiments of the present invention are described with reference to the following drawings, wherein like reference numerals refer to like elements in the various figures, and wherein:

FIG. 1a is a first block diagram illustrating a simplified layout of an N-Channel MOSFET;

FIG. 1b is a second block diagram illustrating a simplified cross-section of an N-Channel MOSFET;

FIGS. 3*a* and 3*b* are schematics of a prior art CMOS inverter and prior art two-input NAND gate;

DETAILED DESCRIPTION

Overview

Figures 2A, 2B:
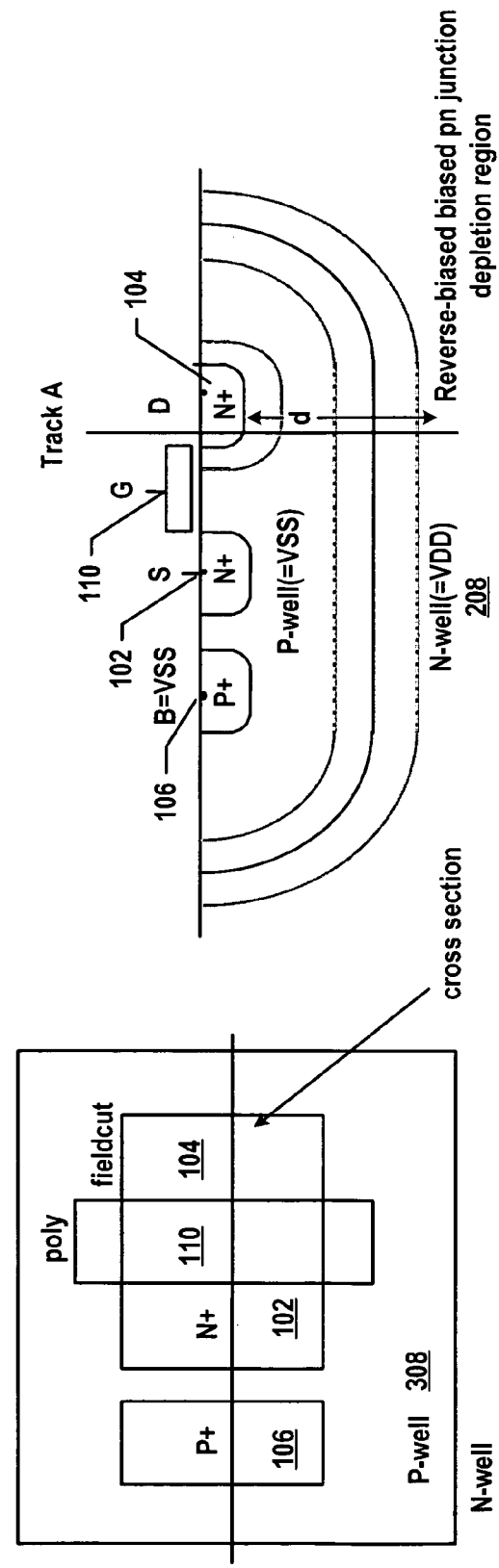
FIG. 2a is a third block diagram illustrating a simplified layout of another N-Channel MOSFET.
FIG. 2b is a fourth block diagram illustrating a simplified cross-section of another N-Channel MOSFET.
Figure 4:
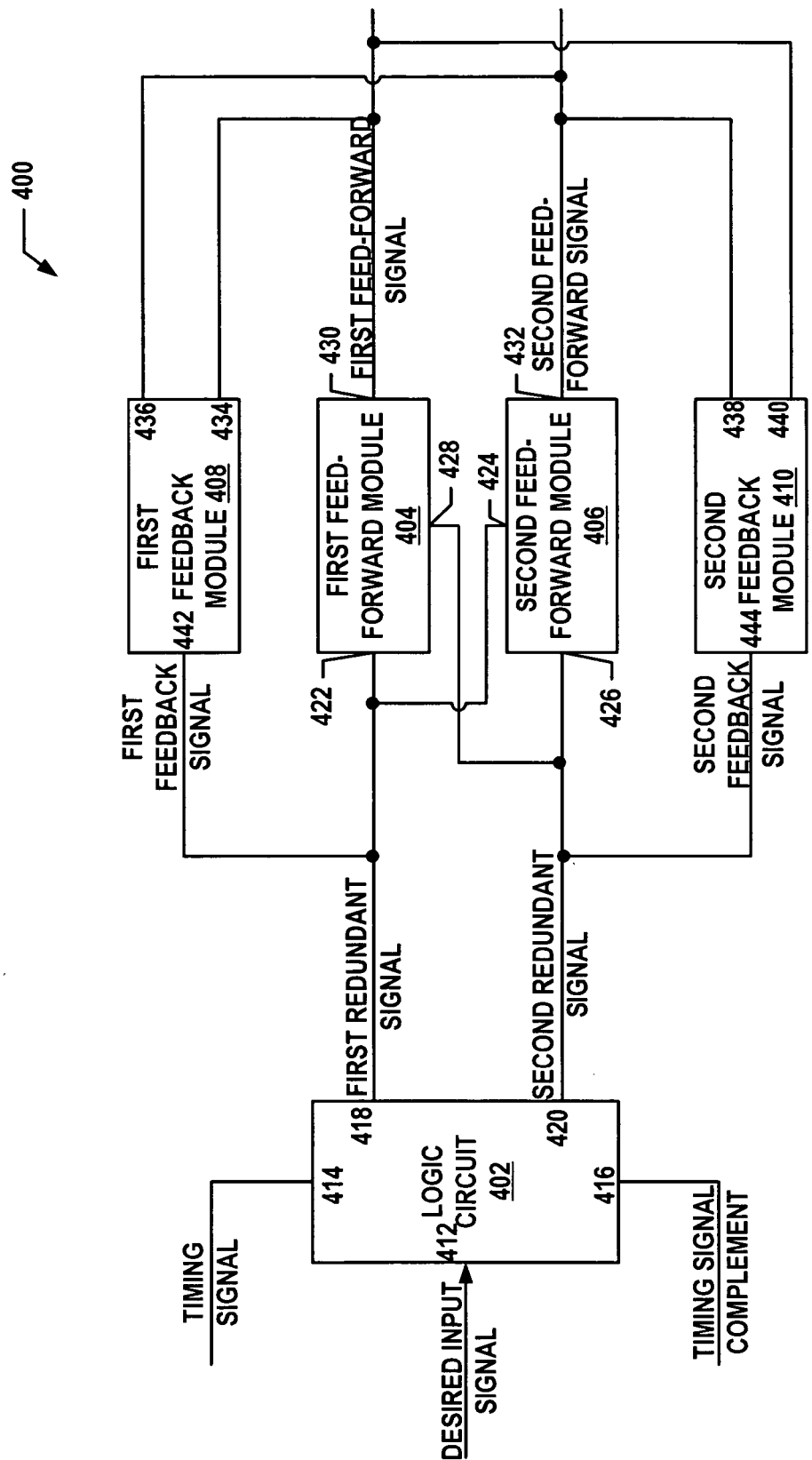
FIG. 4 is a fifth block diagram illustrating exemplary architecture of a cross-enabled, interlocked logic system.

FIG. 4 is a block diagram illustrating exemplary architecture of a cross-enabled, interlocked logic system 400 for hardening a logic circuit against single-event upset (SEU) and/or single-event transient (SET) conditions in accordance with an exemplary embodiment. This cross-enabled, interlocked logic system 400 may be deployed with logic circuitry 402 that provides independently-obtained redundant signals. The construction (e.g., transistor-level fabrication and configuration) of the logic circuitry 402 may provide a first level of hardening against SEU and/or SET conditions.

The cross-enabled, interlocked logic system 400 may also be deployed with first and second feed-forward modules 404, 406 and first and second feedback modules 408, 110. By their construction and intercoupling (i.e., the manner in which the modules are coupled together), the first and second feed-forward modules 404, 406 and feedback modules 408, 410 provide not only the first level, but also, a second level of hardening against SEU and/or SET conditions.

In addition, a third level of hardening against SEU and/or SET conditions may be provided by certain layout configurations of the cross-enabled, interlocked logic system 400. As will be described in more detail below, the cross-enabled, interlocked logic system 400 may be hardened against single, dual, and quadruple radiation particle intrusions using the combination of the three levels of hardening (i.e., construction, intercoupling and layout).

Exemplary Architecture

The logic circuitry 402, the first and second feed-forward modules 404, 406 and the first and second feedback modules 408, 410 may be constructed using hardware, such as logic, processor and/or other circuitry; software executable by the hardware; and/or some combination thereof. The hardware circuitry may, for instance, be constructed using two or more serially coupled or "stacked" transistors (collectively referred to as a "transistor stack"). The construction and transistor-interconnection attributes of the transistor stack may be operable to prevent radiation or radiation particles from turning on or flipping the state of all the transistors in the transistor stack, thereby providing the first level of hardening against SEU and/or SET conditions.

The hardware of the logic circuitry 402 may be configured so as to have a first input 412 for receiving a desired input signal. Logically coupled with the first input 412 may be a plurality of control inputs, such as control inputs 414, 416 that are configured to receive a timing signal and a complement thereof. The timing signal and its complement may be used to control one or more output drivers of the logic circuitry 402.

When, for example, the opposite states of the timing signal and the complementary signal thereof are present on the control inputs 414, 416, then logic circuitry 402 (via its logic function and output drivers) may output first and second redundant signals. The logic circuitry 402, however, may alternatively use two timing signals having the same state to control the output drivers. In either case, the first and second redundant signals may be supplied having the same or, conversely, the complementary state of the desired input signal.

Included among the output drivers are at least two independent output drivers 418, 420. These independent output drivers 418, 420 may be configured to supply the first and second redundant signals. That is, the logic circuitry 402 may be deployed with circuitry that independently produces the first and second redundant signals, i.e., signals having the same or "expected" state.

The first and second redundant signals may be fed to respective inputs 422, 426 of the first and second feed-forward modules 404, 406. In addition, the first and second redundant signals may be cross fed or "cross-coupled" to inputs 424, 428 of the second and first feed-forward modules 406, 404, respectively. By way of this cross-coupling or intercoupling, the first and second feed-forward modules 404, 406 give the cross-enabled, interlocked logic system 400 a second level of hardening against SEU and/or SET conditions, as described in more detail below.

The first and second feed-forward modules 404, 406 may also be configured with a plurality of control inputs (not shown) for receiving a timing signal and complement thereof. This timing signal and the complement thereof may or may not be the same as the timing signal supplied to the logic circuitry 402. In an alternative embodiment, the first and second feed-forward modules 404, 406, however, might not be configured to receive the timing signal and complement thereof.

The first and second feed-forward modules 404, 406 may also be configured with output drivers 430, 432 operable to produce respective first and second feed-forward signals in response to a logical operation on the respective and cross-coupled first and second redundant signals. If, for example, both of the first and second redundant signals are in an expected "high" state, and the first feed-forward module 404 is operable to perform a comparison operation on its inputs 422, 428, then the output driver 430 of the first feed-forward module may produce a first feed-forward signal having a high state.

The output driver 430 of the first feed-forward module 404 may, however, be configured to produce a first feed-forward signal having a complementary state of the first redundant signal if another (e.g., inverting) or alternative other logical operation is performed. Similarly, the second feed-forward module 406 (via its logical operators and output driver) may be configured to produce a second feed-forward signal having the same or complementary state of the second redundant signal.

If, however, either of the first and second redundant signals is not in its expected state, then the cross-coupling prevents the first and second feed-forward modules 404, 406 from further propagating these errant signals. To facilitate this, the first or second feed-forward modules 404, 406 do not change the state of their respective feed-forward signals whenever the first and second redundant signals are not the same. Alternatively, the first and second feed-forward modules 404, 406 may float the first and/or second feed-forward signals whenever the first and second redundant signals are not the same. That is, the output drivers 430, 432 of the first and second feed-forward modules 404, 406 may (i) leave the first and/or second feed-forward signals unchanged, and/or (ii) not further propagate unexpected states.

The first and second feed-forward signals may be fed to other circuitry or devices along with being fed to inputs 434, 438 of the first and second feedback modules 408, 410, respectively. In accordance with the second level of hardening, the first and second feed-forward signals may be cross fed or "cross-coupled" to inputs 440, 436 of the second and first feedback modules 410, 408. That is, the first feed-forward signal may be fed to the input 440 of the second feedback module 410, and the second feed-forward signal may be fed to the input 436 of the first feedback module 408.

Each of the first and second feedback modules 408, 410 may also be configured with an output driver, such as output drivers 442, 444. These output drivers 442, 444 are operable to feed first and second feedback signals that result from a logical operation on the cross-coupled first and second feed-forward signals to the first and second redundant signals. When, for example, the first and second feed-forward signals are in expected states, then the first and second feedback modules 408, 410 may feed the expected state or complement of the expected state back to the respective first and second redundant signals.

If, however, the first feed-forward signal is not in the expected state, then the output driver of the first feedback module 404 may float the first feedback signal. The output driver 442 may, for example, leave the first feedback signal unchanged or, alternatively, not transfer the unexpected state back to the first redundant signal. Similarly, the output driver 444 of the second feedback module 406 may float the second feedback signal when the second feed-forward signal is not in its expected state.

Thus, if a radiation particle intrudes upon the circuitry of any of the logic circuitry 402, the first and second feed-forward modules 404, 406, and/or the first and second feedback modules 408, 410, then the error caused by the intrusion is not further propagated through the cross-enabled, interlocked logic system 400. For example, if a radiation particle intrudes upon the logic circuitry 402 or other circuitry affecting the first redundant signal so as to cause the first redundant signal to be in an unexpected state, then the first feed-forward module 404 does not propagate the errant signal. This happens because the logical operation performed on the cross-fed second redundant signal and the first redundant signal causes the output driver 430 of the first-feedforward module 404 to leave the first feed-forward signal unchanged.

Similarly, if the second feed-forward signal enters an unexpected state as a result of a radiation particle intruding upon the second feed-forward module 406, then the output driver 444 of the second feedback module 410 does not propagate this errant signal to cause the second redundant signal to undesirably change state. This desirable operation occurs because the logical operation performed on the cross-fed first and second feed-forward signals cause the output driver 444 of the second feedback module 410 to leave the second redundant signal unchanged.

The first and second feedback modules 408, 410 may leave the first and second redundant signals unchanged for so long as the radiation particle affects the second feed-forward signal. As one skilled in the art will recognize, the cross-coupling or intercoupling of the cross-enabled, interlocked logic system 400 provides the second level of hardening noted above.

Exemplary Alternative Architecture

Figure 5:
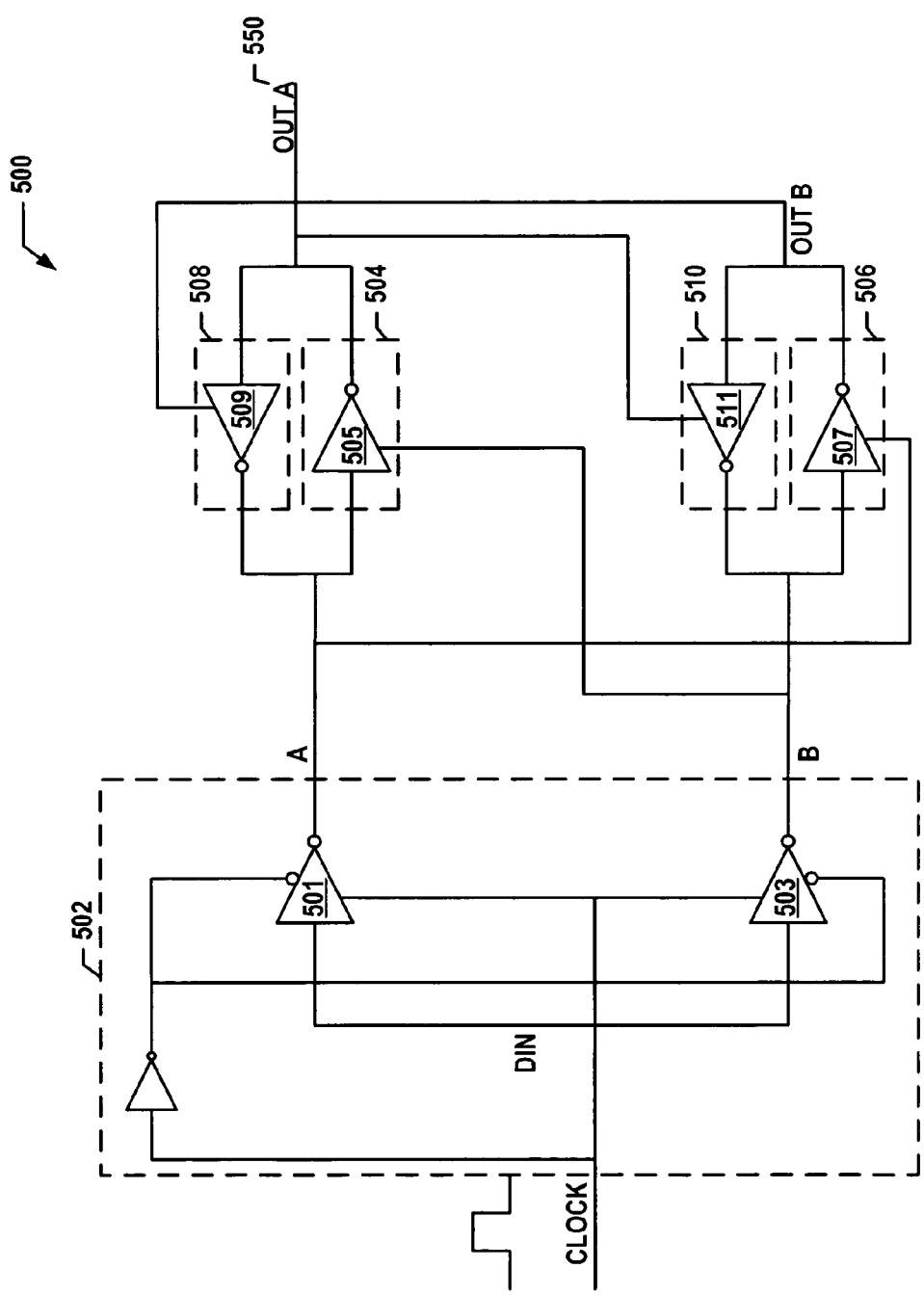
FIG. 5 is a sixth block diagram illustrating another exemplary architecture of a cross-enabled, interlocked logic system.

FIG. 5 is a block diagram illustrating another exemplary architecture of a cross-enabled, interlocked logic system 500 for hardening a logic circuit against SEU and/or SET conditions. On a fundamental level, the cross-enabled, interlocked logic system 200 relies on circuitry redundancies, detection of differing intermediary signals, and intercoupling to provide an output signal that is unaffected by multiple strikes of radiation particles.

Taking advantage of the ability to float its output signal when its inputs differ, the cross-enabled, interlocked logic system 500 may be deployed with logic circuitry 202 that may be constructed from first and second tristate inverters 501, 503. The tristate inverters 501, 503 may provide independent first and second redundant signals, each of which can be in any of three states (i.e., high, low or floating).

Figure 6:
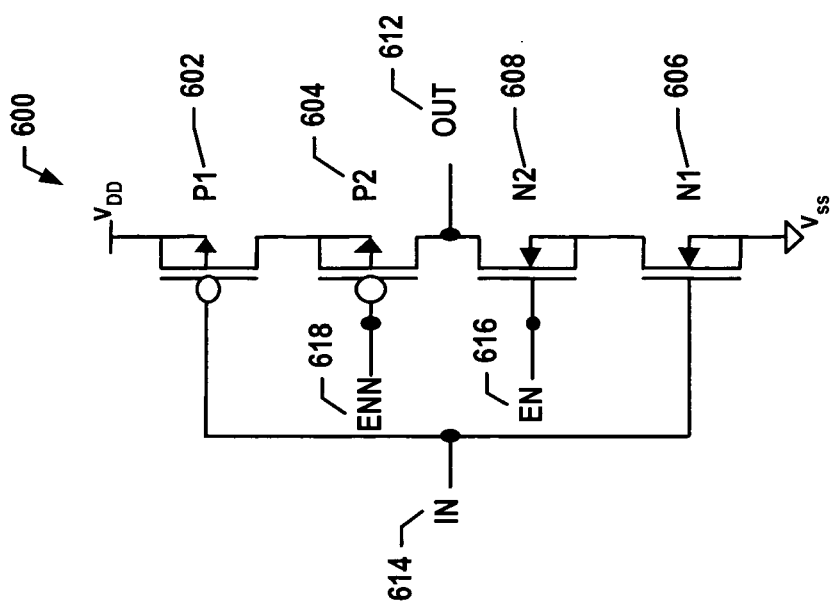
FIG. 6 is a schematic diagram illustrating a three-input-tristate inverter.

Referring to FIG. 6, a schematic diagram illustrating a three-input-tristate inverter 600 that may be used to form the first and/or second tristate inverters 501, 503 is shown. The three-input-tristate inverter 600 may include first and second P-Channel transistors 602, 604 and first and second N-Channel transistors 606, 608. The first N-Channel transistor 606 may be connected in series with the second N-Channel transistors 608. The two N type transistors may be connected between a ground supply node ($V_{SS}$) and an output (OUT) node 612.

The first P-Channel transistor 602 may be connected in series with the second P-Channel transistor 604. The first and second P-Channel transistors 602, 604 may be connected between a power supply node ($V_{DD}$) and the OUT node 612. The gate terminals of the first N-Channel and the first P-Channel transistors 606, 602 are connected to form a first input (IN) node 614. The gate terminal of second N-Channel transistor 608 forms a second input (EN) node 616, and the gate terminal of the second P-Channel transistors 604 forms a third input (ENN) node 618.

The operation of the three-input-tristate inverter 600 is such that when the EN signal on the EN node 616 is at a high state (e.g., a logic 1) and an ENN signal at the ENN 618 node is at a low state (e.g., a logic 0), then the logic state on an OUT signal on the OUT node 612 will be the complement of the logic state on an IN signal received on the IN node 614. For example if (i) the IN signal is at a logic 0, (ii) the EN signal is at a logic 1, and (ii) ENN is at a logic 0, then the OUT signal is at a logic 1. Alternatively, if (i) the EN signal is at a logic 0 and (ii) ENN signal is at logic 1, then the OUT node 712 signal will float (commonly referred to as "tristated"). This happens because the logic value on the OUT terminal is not actively driven by either the series combination of first and second N-Channel transistors 606, 608 or the series combination of first and second P-Channel transistors 602, 604. Rather, the OUT node 612 is held at the previous logic state of OUT signal due to a charge storage on the capacitance inherent on any logic signal. Typically, the EN and ENN signals are assumed to be the complement of one another.

Referring back to FIG. 5, the cross-enabled, interlocked logic system 500 may also include two additional intercoupled stages to further harden the system 500 against multiple particle strikes. The first additional stage may be deployed using cross-coupled first and second feed-forward modules 504, 506. The first and second feed-forward modules 504, 506 may also be beneficially constructed from tristate inverters 505, 507, respectively. The second additional stage may be deployed using cross-coupled first and second feedback modules 508, 510. The first and second feedback modules 508, 510 may likewise be constructed using tristate inverters 509, 511, respectively.

Referring back to FIG. 7, a schematic diagram illustrating a dual-input-tristate inverter 700 that may be used to form any of the tristate inverters 505, 507, 509, and 511 is shown. The dual-input-tristate inverter 700 may include first and second P-Channel transistors 702, 704 and first and second N-Channel transistors 706, 708. The first N-Channel transistor 706 may be connected in series with the second N-Channel transistors 708. The first and second N-channel transistors 706, 708 may be connected between a ground supply node ($V_{SS}$) and an output (OUT) node 712. The first P-Channel transistor 702 may be connected in series with the second P-Channel transistors 704. The first and second P-Channel transistors 702, 704 may be connected between a power supply node ($V_{dd}$) and the OUT node 712.

The gate terminals of first N-Channel transistor 706 and the first P-Channel transistor 702 are connected to form a first input (IN1) node 714. Similarly, the gate terminals of second N-Channel transistor 708 and the second P-Channel transistor 704 are connected to form a second input (IN2) node 716.

The operation of the dual-input-tristate inverter 700 is as follows. When both the IN1 and IN2 nodes 714, 716 are in at same logic state, then the dual-input-tristate inverter 700 will drive the complement of that state onto the OUT node 712. For example, if IN1 and IN2 signals are at a logic 1 state, then both first and second N-Channel transistors 706, 708 will be in an ON state so as to provide a conduction path between the OUT node 712 and $V_{SS}$. This may cause the OUT signal driven onto the OUT node 712 to be a logic 0.

If, on the other hand, the IN1 and IN2 signals have opposite logic states, then no conduction path will be formed between OUT node 712, and either the $V_{SS}$ or $V_{DD}$ supply nodes. In this case the OUT signal is tristated because the logic value on OUT node is not actively driven. Consequently, the logic value on OUT node 712 may maintain its previous state due to charge storage, as noted above. In this way, the dual-input-tristate inverter 700 may act as a comparator or voter circuit. That is, if both inputs are at the same state then the OUT node 712 is driven accordingly, if they are not at the same state then the OUT node is held at its previous state until both inputs are the same.

Fabrication Technologies

Each of the tristate inverters 501, 503, 505, 507, 509, and 511 may be fabricated using any of the various fabrication techniques noted above, including Bulk CMOS, SOI, BiCMOS, etc. In bulk technology fabrication, such as bulk CMOS, each MOSFET of the tristate inverters 501, 503, 505, 507, 509, and 511 can have their body ties connected to $V_{DD}$, and/or $V_{SS}$. Due to the common substrate or body ties in bulk technologies, however, parasitic diodes may be created between devices. Such parasitic diodes are probably not an optimal solution against SEU and/or SET conditions. Instead of using a bulk technology, a Silicon-On-Insulator (SOI) or other similar device-insulating fabrication technology may provide a more optimal solution for hardening devices against SET and/or SEU conditions.

Figures 8A, 8B:
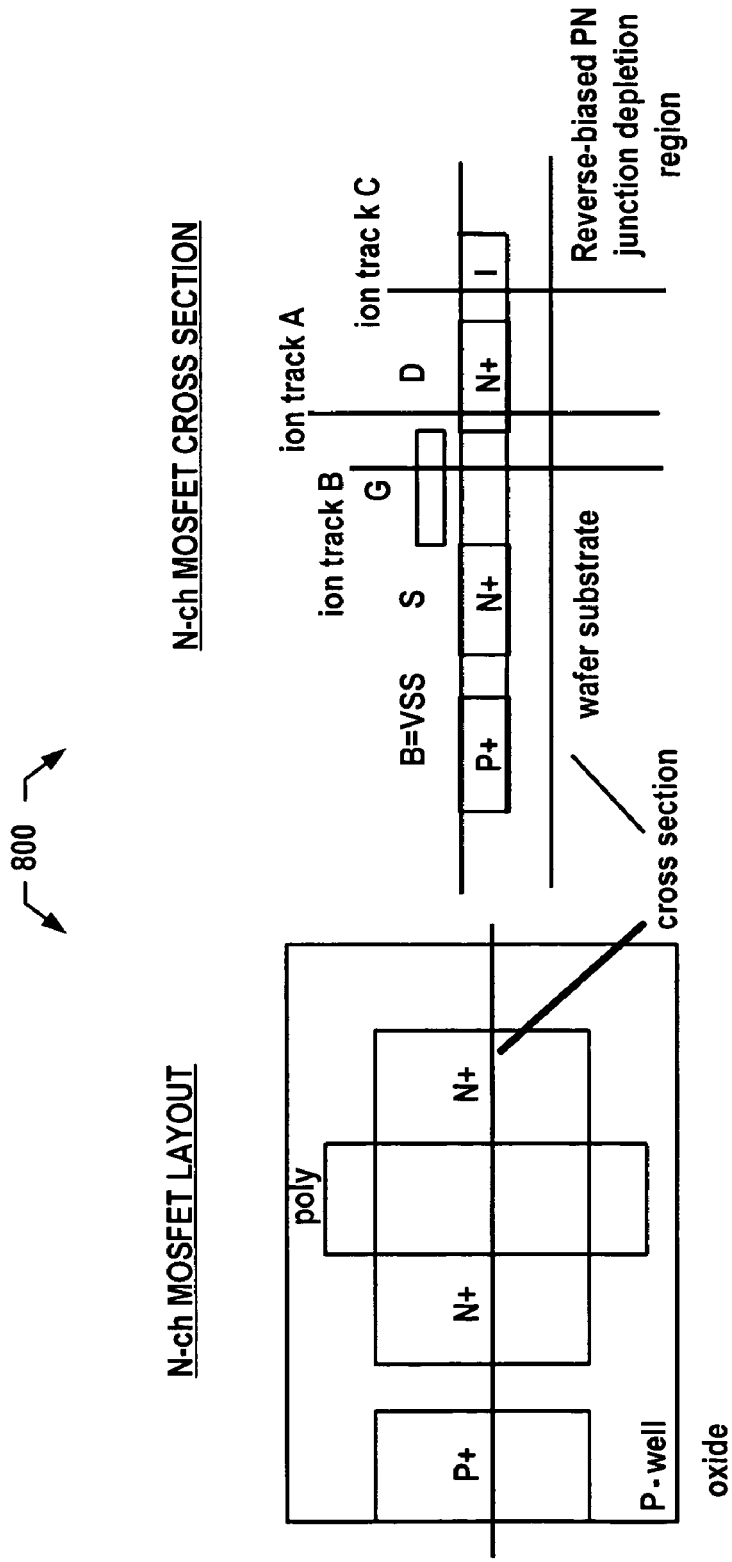
FIG. 8*a* is a simplified layout of a hardened N-Channel MOSFET that may be fabricated using a Silicon-On-Insulator (SOI) fabrication technology.
FIG. 8*b* is a cross-section of the hardened N-Channel MOSFET that may be fabricated using the SOI fabrication technology.

FIG. 8*a* is a simplified layout of a hardened N-Channel MOSFET 800 and FIG. 8*b* is a cross-section of the hardened N-Channel MOSFET 800; both of which may be fabricated using the SOI fabrication technology. When fabricated as such, the substrate well region of N-Channel MOSFET 800 may be isolated (using, for example, oxide-material to separate the N-Channel MOSFET 800) from substrate well regions of other MOSFETs formed in the same circuit. As a result, the N-Channel MOSFET 800 may be fabricated without parasitic diodes formed between and among the N-Channel MOSFET 800, other MOSFETs, $V_{DD}$, and $V_{SS}$.

While particle tracks "A," "B," and "C" are shown normal to the surface of the N-Channel MOSFET 800, particles can strike in any direction and travel along one of a multitude of different straight-line or solid-angle particle tracks. Thus, a particle may possibly travel horizontally through silicon of a stacked transistor module. When this happens to an N-channel transistor stack, such as in the hardened inverter circuit 600, a particle may track through the sensitive volumes of both MOSFETs, but the particle's effect may be orders of magnitude less than through any one MOSFET. By structuring and/or laying-out the hardened inverter circuit 600 or other hardened device, the number of possible particle tracks through which a particle must pass to cause SET and/or SEU conditions may be reduced.

Intercoupling Hardening

Referring back to FIG. 5, both of the first and second feed-forward tristate inverters 505, 507 may be configured to receive these first and second redundant signals so as to exploit circuit redundancies and the ability to tristate. In an exemplary embodiment, the first redundant signal is (i) fed to the gate terminals of the first N-Channel and first P-Channel transistors of the first feed-forward-tristate inverter 505, and (ii) cross fed to the gate terminals of the second N-Channel and second P-Channel transistors of the second feed-forward-tristate inverter 507. Similarly, the second redundant signal may be (i) fed to the gate terminals of the first N-Channel and first P-Channel transistors of the second feed-forward-tristate inverter 507, and (ii) cross fed to the gate terminals of the second N-Channel and second P-Channel transistors of the second feed-forward-tristate inverter 505.

Under desired operation, when the first and second redundant signals are in the same state, the output terminals of both of the first and second feed-forward-tristate inverters 505, 507 supply first and second feed-forward output signals that are complementary to the state of the first and second redundant signals. The logic circuit 502, however, may be configured to provide the first and second redundant signals in complementary states. As such, an inverter (not shown) may be added between one of the first and second feed-forward-tristate inverters 505, 507 to invert one of the first and second redundant signals.

In the former case, when the first and second redundant signals are in a low (or high) state, the output terminals of the first and second feed-forward-tristate inverters 505, 507 supply the first and second feed-forward output signals in a high (or low) state. On the other hand, if, for example, the desired state of the first and second redundant signals is a low state, but the second redundant signal is unexpectedly in a high state, then (i) the first feed-forward-tristate inverter 505 tristates its output signal so as to not change the state of the first feed-forward signal and (ii) the second feed-forward-tristate inverter 507 likewise tristates its output signal so as to not change its state. The converse is true when the first redundant signal is unexpectedly in a high state instead of the second redundant signal. Other combinations are possible as well.

In addition to being available for coupling to another stage of circuitry, the output terminals of the first and second feed-forward-tristate gates 505, 507 supply the first and second feed-forward signals to the gate terminals of the first N-Channel and first P-Channel transistors of the first and second feedback-tristate gates 509, 511, respectively. Making use of the circuit redundancies and the ability to tristate, the first and second feed-forward signals are also cross-fed to the gate terminals of the second N-Channel and second P-Channel transistors of the second and first feedback tristate inverters 511, 509.

When, under intended operation, the first and second feed-forward output signals are in the same state, the output terminals of the first and second feedback-tristate inverters 509, 511 feed the first and second feedback output signals back into gate terminals of the first N-Channel and first P-Channel transistors of the first and second feed-forward-tristate inverters 505, 507. Given that the first and second feedback-tristate inverters 509, 511 are inverters, the first and second feedback output signals may be supplied as complements of the first and second feed-forward output signals. Under desired operation, these first and second feedback output signals are in the same state as the first and second redundant signals, thereby closing the feedback loop.

If, however, the desired state of the first and second feed-forward signals is a low state, but the first feed-forward signal is unexpectedly in a high state, then (i) the second feedback-tristate inverter 511 tristates its output signal so as to not change its state and (ii) the first feedback-tristate inverter 509 also tristates its output signal so as to not change its state. The converse is true when the second feed-forward signal is unexpectedly in a high state instead of the first redundant signal. Other combinations are possible as well.

In light of the foregoing, the fabrication and intercoupling hardening may make the cross-enabled, interlocked logic system 500 immune to not only a single or dual, but a quadruple particle intrusion. Such protection is realizable, given that (i) two or more particle intrusions may be necessary to upset the stacked transistor tristate inverters and (ii) two or more of the inverters 501, 503, 505, 507, 509, and 511 may need to be upset before the cross-enabled, interlocked logic system 500 can be upset. While quadruple particle intrusions are highly unlikely or almost impossible (since it is believed that particles travel in straight lines), the third level of system hardening against SEU and/or SET conditions may be provided to bolster such protection. This protection may be provided using various transistor layout configurations for the cross-enabled, interlocked logic system 500.

System Layout Hardening

Figure 9:
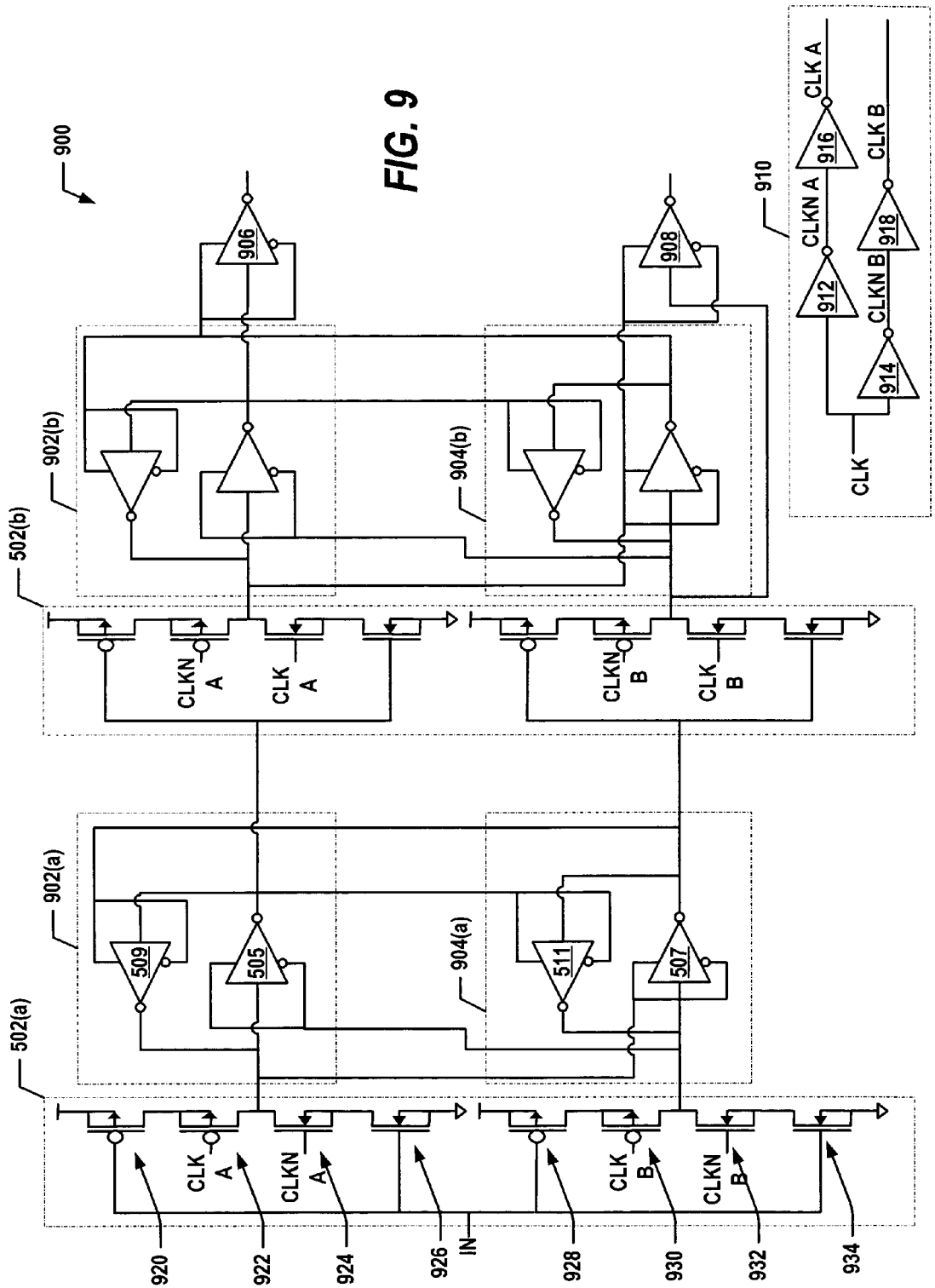
FIG. 9 is a transistor and gate-level circuit diagram illustrating an exemplary interlocked-logic register.

FIG. 9 is a transistor and gate-level circuit diagram illustrating an embodiment of an interlocked-logic register 900. The interlocked logic-register 900 may be formed by cascading a first cross-enabled, interlocked logic system, such as the cross-enabled, interlocked logic system 500, with a second of such systems.

Thus, each of the first and second cross-enabled, interlocked logic systems may be constructed from logic circuitry 502(*a–b*) and first and second latches 902(*a–b*), 904(*a–b*). Each of the first latches 902(*a–b*) may be constructed from the combination of the first feed-forward and first feedback inverters 505, 509. Each of the second latches 904(*a–b*) may be constructed from the combination of the second feed-forward and second feedback inverters 507, 511. Instead of receiving a single desired input signal at the logic circuitry 502(*b*), dual input signals are received. The first of the dual input signals is received from the first latch 902(*a*) and the second of the dual input signals is received from the second latch 904(*a*).

Figure 7:
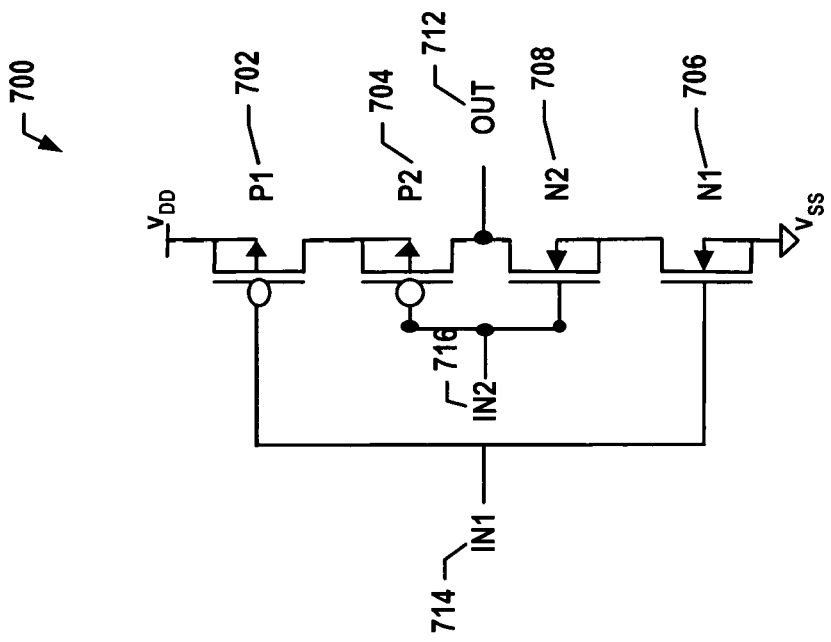
FIG. 7 is a schematic diagram illustrating a dual-input-tristate inverter.

Outputs of the first and second latches 902(*b*), 904(*b*) may be fed to first and second inverting-driver outputs 906, 908. Like the rest of the circuitry of the interlocked logic-register 900 the first and second inverting-driver outputs 908, 908 may be constructed using stacked transistors, such as the tristate inverter 700 (FIG. 7). The first and second inverting-driver outputs 908, 908 may take other forms as well.

As noted above, the output of each of logic circuitry 502(*a–b*) may be controlled by a timing signal and complement thereof. To increase the interlocked logic-register 900 immunity to quadruple particle intrusions, the timing signal and its complement may be separated into dual timing signals and complements thereof. This may be facilitated by clocking circuitry 910.

The clocking circuitry 910 may be formed using first and second clocking inverters 912, 914. The first and second clocking inverters 912, 914 may separate and invert an incoming clocking signal so as to supply redundant first and second complementary timing signals, respectively. The first and second redundant complementary timing signals may then be fed to third and fourth clocking inverters 916, 918. The third and fourth clocking inverters 916, 918 may in turn supply first and second redundant timing signals.

Each of first, second, third and fourth clocking inverters 912–918 may be formed as tristate inverters using, for example, any of the various fabrication techniques noted above. In such construction, each of the first, second, third and fourth clocking inverters 912–918 may provide immunity against dual particle intrusions, and SET and/or SET conditions.

Quadruple-particle-intrusion immunity for the timing signal controlled circuitry, however, may be realizable without intercoupling hardening. If, for example, the logic circuit 502(*a*) is formed from first and second P-Channel transistors 920, 922 coupled in series with first and second N-Channel transistors 924, 926 as noted above, then the transistor fabrication of these transistors 920–926 may allow for hardness against dual particle intrusions.

By physically locating the transistors of the first and second tristate inverters 920–926 and 928–934 in such a way as to prevent a single particle track from passing through all four N type transistors 924, 926, 932, and 934 or all four P type transistors 920, 922, 928, and 930, both redundant signals can be prevented from experiencing a simultaneous radiation induced transient upset. Similarly, by locating clocking inverters 912 and 916 apart from inverters 914 and 918 a single particle track can be prevented from upsetting both clock signals simultaneously. On the other hand, fabrication and intercoupling hardening allow the tristate inverters of the first and second latches 902(*a–b*), 904(*a–b*) to be co-located, thereby saving precious circuit area.

Figure 10:
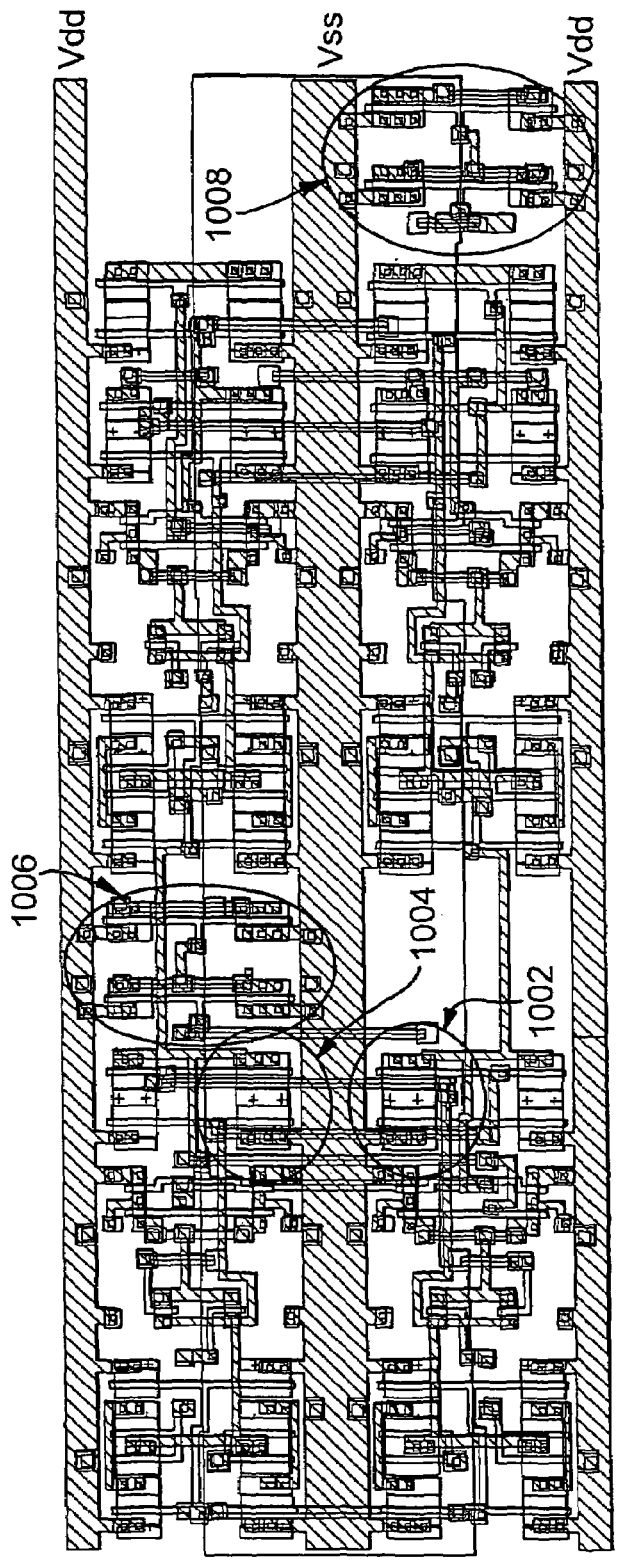
FIG. 10 is a component-level circuit diagram illustrating an architectural layout of an interlocked-logic register.

FIG. 10 is a component-level circuit diagram illustrating an architectural layout of interlocked-logic register 900. The interlocked logic-register 900 illustrated in FIG. 10 is formed in a "rail-stack" configuration. In this rail-stack configuration, three rails are deployed. The first and third rails provide separate running connections to $V_{DD}$. The second rail is a common rail providing a running connection to $V_{SS}$. One skilled in the art will recognize that depending on the type of transistors used, the first and third rails may provide a running connection to $V_{SS}$, and the second rail may provide a running connection to $V_{DD}$.

As shown by callouts 1002, 1004, the tristate inverters of the first and second feed-forward inverters 505, 507 may be co-located since no particle intrusion can strike all their transistors. Callouts 1006, 1008, however, illustrate strategic placement of the clocking inverters 912 and 916 apart from inverters 914 and 918.

CONCLUSION

In view of the wide variety of embodiments to which the principles of the present invention can be applied, it should be understood that the illustrated embodiments are exemplary only, and should not be taken as limiting the scope of the present invention. For example, the steps of the operational modes may be taken in sequences other than those described, and more or fewer elements may be used in the block diagrams. In addition, use of the term "means" in any claim is intended to invoke 35 U.S.C. §112, paragraph 6, and an claim without the word "means" is not so intended. Therefore, all embodiments that come within the scope and spirit of the following claims and equivalents thereto are claimed as the invention.

It will be understood, however, that changes and modifications may be made to the invention without deviating from its true spirit and scope, as defined by the following claims.

What is claimed is:

1. A system for hardening a logic circuit against at least one of a single-event upset and single-event transient condition, the system comprising in combination:
   a logic circuit outputting independently-obtained first and second redundant signals;
   first and second feed-forward devices, wherein each of the first and second feed-forward devices is operable to receive both of the first and second redundant signals, and wherein when the first and second redundant signals are in expected states, then (i) the first feed-forward device responsively provides a first feed-forward signal and (ii) the second feed-forward device responsively provides a second feed-forward signal, and wherein when at least one of the first and second redundant signals is in an unexpected state, then both the first and second feed-forward devices continue to provide their respective feed-forward signals consistent with the last expected state of the redundant signals; and
   first and second feedback devices, wherein each of the first and second feedback devices is operable to receive both of the first and second feed-forward signals, and wherein when the first and second feed-forward signals are in expected states, (i) the first feedback device responsively feeds a first feedback signal back to the first redundant signal and (ii) the second feedback device responsively feeds a second feedback signal back to the second redundant signal, and wherein when at least one of the first and second feed-forward signals is in an unexpected state, then both the first and second feedback devices continue to provide their respective feedback signals consistent with the last expected state of the feed-forward signals.

2. The system of claim 1, wherein at least one of the first and second redundant signals is in the unexpected state as a result of a radiation-particle intrusion.

3. The system of claim 1, wherein the unexpected state is propagated by any of the logic circuit, the first and second redundant signals, and the first and second feedback modules.

4. The system of claim 1, wherein at least one of the first and second feed-forward signal is in the unexpected state as a result of a radiation-particle intrusion.

5. The system of claim 1, wherein the unexpected state occurs in any of the logic circuit, the first and second redundant signals, the first and second feed-forward modules, and the first and second feed-forward signals.

6. The system of claim 1, wherein any of the logic circuit, first and second feed-forward devices, and first and second feedback devices comprise radiation-particle-hardened circuitry.

7. The system of claim 1, wherein any of the logic circuit, first and second feed-forward devices, and first and second feedback devices are operable to receive respective enable signals, and wherein the respective enable signals allow (i) the logic circuit to provide a current state of the first and second redundant signals, (ii) the first and second feed-forward devices to provide a current state of their respective first and second feed-forward signals, and (iii) the first and second feedback devices to provide a current state of their respective first and second feedback signals.

8. The system of claim 7, wherein the current state comprises any of a high state, a low state, and a floating state.

9. The system of claim 7, further including a clocking circuit to provide the respective enable signals.

10. The system of claim 9, wherein the clocking circuit comprises radiation-particle-hardened circuitry.

11. The system of claim 1, wherein any of the logic circuit, first and second feed-forward devices, and first and second feedback devices are operable to receive respective enable and complementary signals, and wherein the respective enable and complementary signals allow (i) the logic circuit to provide a current state of the first and second redundant signals, (ii) the first and second feed-forward devices to provide a current state of their respective first and second feed-forward signals, and (iii) the first and second feedback devices to provide a current state of their respective first and second feedback signals.

12. The system of claim 11, wherein the current state comprises any of a high state, a low state, and a floating state.

13. The system of claim 11, further including a clocking circuit to provide the respective enable and complementary signals.

14. The system of claim 1, wherein the logic circuit, first and second feed-forward devices, and first and second feedback devices are fabricated using a bulk silicon technology.

15. The system of claim 1, wherein the logic circuit, first and second feed-forward devices, and first and second feedback devices are fabricated using a device-insulating technology.

16. The system of claim 15, wherein the device-insulating technology comprises a silicon-on-insulator technology.

17. The system of claim 1, wherein the logic circuit comprises first and second logic gates, wherein each of the first and second logic gates has (i) at least one input for receiving a desired input signal and (ii) an output for producing its redundant signal.

18. The system of claim 17, wherein the first and second logic gates comprise radiation-particle-hardened circuitry.

19. The system of claim 17, wherein the logic circuit is fabricated according to a tri-rail system having a common rail operable to provide a first potential, and first and second adjacent rails operable to provide a second potential, wherein the first logic gate is formed between the first adjacent rail and the common rail, and wherein the second logic gate is formed between the second adjacent rail and the common rail.

20. The system of claim 19, wherein the first gate is physically offset from the second gate so as to prevent a single particle from passing through both gates and causing both to experience a single event upset condition.

21. The system of claim 17, wherein each of the first and second gates further include at least one input for receiving an enable signal, and wherein the enable signal allows each of the first and second gates to provide a current state of its respective redundant signal.

22. The system of claim 19, wherein the current state of the respective redundant signals comprises any of a high state, a low state, and a floating state.

23. The system of claim 17, wherein each of the first and second logic gates further include at least two inputs for receiving enable and complementary signals, and wherein the enable and complementary signals allow each of the first and second logic gates to provide a current state of its respective redundant signal.

24. The system of claim 23, wherein the current state of the respective redundant signals comprises any of a high state, a low state, and a floating state.

25. The system of claim 23, further including a clocking circuit to provide the enable and complementary signals.

26. The system of claim 25, wherein the clocking circuit includes first and second clocking modules, wherein the first clocking module is operable to provide to the first gate independently-obtained first enable and complementary signals, wherein the second clocking module is operable to provide to the second gate independently-obtained second enable and complementary signals.

27. The system of claim 26, wherein the first and second clocking modules are physically offset from each other to prevent a single particle from passing through both clock modules and causing both to experience a single event upset condition.

28. The system of claim 26, wherein the clocking circuit is fabricated according to a tri-rail system having a common rail operable to provide a first potential, and first and second adjacent rails operable to provide a second potential, wherein the first clocking module is formed between the first adjacent rail and the common rail, and wherein the second clocking module is formed between the second adjacent rail and the common rail.

29. The system of claim 28, wherein the first clock module is physically offset from the second clocking module so as to prevent a single particle from passing through both clock modules and causing both to experience a single event upset condition.

30. The system of claim 1, wherein the first feed-forward device comprises at least one logic gate, wherein the at least one logic gate has (i) at least two inputs, and (ii) an output for producing its feed forward signal, wherein one of the inputs is operable to receive the first redundant signal, and wherein another of the inputs is operable to receive the second redundant signal.

31. The system of claim 30, wherein the at least one logic gate comprises radiation-particle-hardened circuitry.

32. The system of claim 30, wherein the first feed-forward device is fabricated according to a tri-rail system having a common rail operable to provide a first potential, and first and second adjacent rails operable to provide a second potential, wherein the at least one logic gate is formed between the first adjacent rail and the common rail.

33. The system of claim 1, wherein the second feed-forward device comprises at least one logic gate, wherein the at least one logic gate has (i) at least two inputs, and (ii) an output for producing its feed forward signal, wherein one of the inputs is operable to receive the first redundant signal, and wherein another of the inputs is operable to receive the second redundant signal.

34. The system of claim 33, wherein the at least one logic gate comprises radiation-particle-hardened circuitry.

35. The system of claim 33, wherein the second feed-forward device is fabricated according to a tri-rail system having a common rail operable to provide a first potential, and first and second adjacent rails operable to provide a second potential, wherein the at least one logic gate is formed between the first adjacent rail and the common rail.

36. The system of claim 1, wherein the first feedback device comprises at least one logic gate, wherein the at least one logic gate has (i) at least two inputs, and (ii) an output for producing its feedback signal, wherein one of the inputs is operable to receive the first feed-forward signal, and wherein another of the inputs is operable to receive the second feed-forward signal.

37. The system of claim 36, wherein the at least one logic gate comprises radiation-particle-hardened circuitry.

38. The system of claim 36, wherein the first feedback device is fabricated according to a tri-rail system having a common rail operable to provide a first potential and first and second adjacent rails operable to provide a second potential, wherein the at least one logic gate is formed between the first adjacent rail and the common rail.

39. The system of claim 36, wherein the at least one logic gate comprises radiation-particle-hardened circuitry.

40. The system of claim 36, wherein the second feedback device is fabricated according to a tri-rail system having a common rail operable to provide a first potential and first and second adjacent rails operable to provide a second potential, wherein the at least one logic gate is formed between the first adjacent rail and the common rail.

41. The system of claim 36, wherein the second feedback device is fabricated according to a tri-rail system having a common rail operable to provide a first potential and first and second adjacent rails operable to provide a second potential, wherein the at least one logic gate is formed between the second adjacent rail and the common rail.

42. The system of claim 1, wherein the second feedback device comprises at least one logic gate, wherein the at least one logic gate has (i) at least two inputs, and (ii) an output for producing its feedback signal, wherein one of the inputs is operable to receive the first feed-forward signal, and wherein another of the inputs is operable to receive the second feed-forward signal.

43. A system for hardening a logic circuit against at least one of a single-event upset and single-event transient condition, the system comprising in combination:
first and second tristate inverters, wherein responsive to a desired input signal, the first and second tristate inverters are operable to provide respective first and second redundant signals, and wherein the first and second redundant signals are in an expected state;
first and second feed-forward-tristate inverters, wherein each the first and second feed-forward-tristate inverters is operable to receive both of the first and second redundant signals, and wherein when both of the first and second redundant signals are in the expected state, then (i) the first feed-forward-tristate inverter responsively provides a first feed-forward signal having a state complementary to the expected state and (ii) the second feed-forward device responsively provides a second feed-forward signal having a state complementary to the expected state; and first and second feedback-tristate inverters, wherein each of the first and second feedback-tristate inverters is operable to receive both of the first and second feed-forward signals, and wherein when both the first and second feed-forward signals are in the complementary state, then (i) the first feedback-tristate inverter responsively feeds back to the first redundant signal a first feedback signal having the same state as the expected state of the first redundant signal and (ii) the second feedback device responsively feeds back to the second redundant signal a second feedback signal having the same state as the expected state of the second redundant signal.

44. The system of claim 43, wherein when at least one of the first and second redundant signals is in an unexpected state, then at least one of the first and second feed-forward-tristate inverters floats its output so as to not propagate the unexpected state of the redundant signals and instead maintains the expected state of the respective feed-forward signal.

45. The system of claim 44, wherein at least one of the first and second redundant signals is in the unexpected state as a result of an radiation-particle intrusion.

46. The system of claim 45, wherein the unexpected state is propagated by any of the first and second tristate inverters, the first and second redundant signals, and the first and second feedback-tristate inverters.

47. The system of claim 43, wherein when at least one of the first and second feed-forward signals is in an unexpected state, then at least one of the first and second feedback-tristate inverters floats its output so as to not propagate the unexpected state of the feed-forward signals and instead maintains the expected state of the respective feed-back signal.

48. The system of claim 47, wherein at least one of the first and second feed-forward signal is in the unexpected state as a result of an radiation-particle intrusion.

49. The system of claim 47, wherein the unexpected state is propagated by any of the first and second tristate inverters, the first and second redundant signals, the first and second feed-forward-tristate inverters, and the first and second feed-forward signals.

50. The system of claim 43, wherein each of the first and second tristate inverters, first and second feed-forward-tristate inverters, and first and second feedback-tristate inverters comprises at least one radiation-particle-hardened-tristate inverter.

51. A method for hardening a logic circuit against at least one of a single-event upset and single-event transient condition, the method comprising in combination:

providing to first and second feed-forward devices independently-obtained first and second redundant signals, wherein the first redundant signal is in an expected state and the second redundant signal is in an unexpected state;

providing to first and second feedback devices a first feed-forward signal as a function of logic operation on both of the first and second redundant signals, wherein the logic operation is operable to not change a current state of the first feed-forward signal;

providing to first and second feedback devices a second feed-forward signal as a function of logic operation on both of the first and second redundant signals, wherein the logic operation is operable to not change a current state of the second feed-forward signal;

providing to the first redundant signal a first feedback signal as a function of logic operation on both of the first and second feed-forward signals, wherein the logic operation is operable to not change a current state of the first feedback signal; and providing to the second redundant signal a second feedback signal as a function of logic operation on both of the first and second feed-forward signals, wherein the logic operation is operable to not change a current state of the second feedback signal.

52. A method for hardening a logic circuit against at least one of a single-event upset and single-event transient condition, the method comprising in combination:

providing to first and second feed-forward devices independently-obtained first and second redundant signals, wherein the first redundant signal in an unexpected state and the second redundant signal in an expected state;

providing to first and second feedback devices a first feed-forward signal as a function of logic operation on both of the first and second redundant signals, wherein the logic operation is operable to not change a current state of the first feed-forward signal;

providing to first and second feedback devices a second feed-forward signal as a function of logic operation on both of the first and second redundant signals, wherein the logic operation is operable to not change a current state of the second feed-forward signal;

providing to the first redundant signal a first feedback signal as a function of logic operation on both of the first and second feed-forward signals, wherein the logic operation is operable to not change a current state of the first feedback signal; and providing to the second redundant signal a second feedback signal as a function of logic operation on both of the first and second feed-forward signals, wherein the logic operation is operable to not change a current state of the second feedback signal.

53. A method for hardening a logic circuit against at least one of a single-event upset and single-event transient condition, the method comprising in combination:

providing to first and second feed-forward devices independently-obtained first and second redundant signals as a function of logic operation on a desired input signal, wherein the logic operation is operable to provide the first and second redundant signals in first expected states;

providing to first and second feedback devices a first feed-forward signal in an unexpected state;

providing to first and second feedback devices a second feed-forward signal as a function of logic operation on both of the first and second redundant signals, wherein the logic operation is operable to provide the second feed-forward signal in a second expected state;

providing to the first redundant signal a first feedback signal as a function of logic operation on both of the first and second feed-forward signals, wherein the logic operation is operable to not change a current state of the first feedback signal; and providing to the second redundant signal a second feedback signal as a function of logic operation on both of the first and second feed-forward signals, wherein the logic operation is operable to not change a current state of the second feedback signal.

54. A method for hardening a logic circuit against at least one of a single-event upset and single-event transient condition, the method comprising in combination:

provinding to first and second feed-forward devices independently-obtained first and second redundant signals as a function of logic operation on a desired input signal, wherein the logic operation is operable to provide the first and second redundant signals in first expected states;

providing to first and second feedback devices a first feed-forward signal as a function of logic operation on both of the first and second redundant signals, wherein the logic operation is operable to provide the first feed-forward signal in a second expected state;

providing to first and second feedback devices a second feed-forward signal in an unexpected state;

providing to the first redundant signal a first feedback signal as a function of logic operation on both of the first and second feed-forward signals, wherein the logic operation is operable to not change a current state of the first feedback signal; and providing to the second redundant signal a second feedback signal as a function of logic operation on both of the first and second feed-forward signals, wherein the logic operation is operable to not change a current state of the second feedback signal.

* * * * *

UNITED STATES PATENT AND TRADEMARK OFFICE
CERTIFICATE OF CORRECTION

| | |
|---|---|
| PATENT NO. | : 7,142,004 B2 |
| APPLICATION NO. | : 10/759913 |
| DATED | : November 28, 2006 |
| INVENTOR(S) | : Roy M. Carlson |

Page 1 of 1

It is certified that error appears in the above-identified patent and that said Letters Patent is hereby corrected as shown below:

On the title page, at item [12], please delete "Calrson", replace with -- Carlson --.

On the title page, at item [75], please delete "Calrson", replace with -- Carlson --.

Column 19, line 44, please delete "an", replace with -- a --.

Signed and Sealed this

Twenty-ninth Day of May, 2007

JON W. DUDAS
*Director of the United States Patent and Trademark Office*